(12) United States Patent
Martin et al.

(10) Patent No.: US 11,865,641 B1
(45) Date of Patent: Jan. 9, 2024

(54) ADDITIVELY MANUFACTURED SINGLE-CRYSTAL METALLIC COMPONENTS, AND METHODS FOR PRODUCING THE SAME

(71) Applicant: HRL Laboratories, LLC, Malibu, CA (US)

(72) Inventors: John H. Martin, Oxnard, CA (US); Jacob M. Hundley, Thousand Oaks, CA (US); Brennan D. Yahata, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 964 days.

(21) Appl. No.: 16/442,614

(22) Filed: Jun. 17, 2019

Related U.S. Application Data

(60) Provisional application No. 62/741,023, filed on Oct. 4, 2018.

(51) Int. Cl.
*C30B 29/52* (2006.01)
*B23K 26/342* (2014.01)
(Continued)

(52) U.S. Cl.
CPC .......... *B23K 26/342* (2015.10); *B22F 3/1028* (2013.01); *B22F 10/10* (2021.01);
(Continued)

(58) Field of Classification Search
CPC ......... C30B 13/06; C30B 13/24; C30B 19/08; C30B 29/52; C30B 29/68; B23K 26/342; B33Y 80/00
See application file for complete search history.

(56) References Cited

U.S. PATENT DOCUMENTS

| 5,305,726 A | 4/1994 | Scharman et al. |
| 5,340,012 A | 8/1994 | Beeferman et al. |

(Continued)

FOREIGN PATENT DOCUMENTS

| EP | 2792771 A1 | 10/2014 |
| WO | 2005017220 A1 | 2/2005 |

OTHER PUBLICATIONS

Chen et al., "Rapid control of phase growth by nanoparticles," Nature Communications 5:3879 DOI: 10.1038/ncomms4879.
(Continued)

*Primary Examiner* — Robert M Kunemund
(74) *Attorney, Agent, or Firm* — O'Connor & Company; Ryan P. O'Connor

(57) ABSTRACT

Some variations provide a method of making an additively manufactured single-crystal metallic component, comprising: providing a feedstock comprising a first metal or metal alloy; providing a build plate comprising a single crystal of a second metal or metal alloy; exposing the feedstock to an energy source for melting the feedstock, generating a melt layer on the build plate; and solidifying the melt layer, generating a solid layer (on the build plate) of a metal component. The solid layer is also a single crystal of the first metal or metal alloy. The method may be repeated many times to build the part. Some variations provide a single-crystal metallic component comprising a plurality of solid layers in an additive-manufacturing build direction, wherein the plurality of solid layers forms a single crystal of a metal or metal alloy with a continuous crystallographic texture. The crystal orientation may vary along the additive-manufacturing build direction.

9 Claims, 10 Drawing Sheets
(7 of 10 Drawing Sheet(s) Filed in Color)

(51) Int. Cl.
| | |
|---|---|
| *B23K 9/04* | (2006.01) |
| *B23K 26/06* | (2014.01) |
| *B23K 26/073* | (2006.01) |
| *C30B 13/32* | (2006.01) |
| *C30B 19/08* | (2006.01) |
| *C30B 13/24* | (2006.01) |
| *C30B 13/06* | (2006.01) |
| *C30B 29/68* | (2006.01) |
| *B22F 3/10* | (2006.01) |
| *B22F 10/10* | (2021.01) |
| *B33Y 80/00* | (2015.01) |
| *C30B 29/00* | (2006.01) |
| *B33Y 70/00* | (2020.01) |
| *B33Y 10/00* | (2015.01) |
| *B33Y 30/00* | (2015.01) |

(52) U.S. Cl.
CPC .......... *B23K 9/044* (2013.01); *B23K 26/0604* (2013.01); *B23K 26/0734* (2013.01); *B33Y 80/00* (2014.12); *C30B 13/06* (2013.01); *C30B 13/24* (2013.01); *C30B 13/32* (2013.01); *C30B 19/08* (2013.01); *C30B 29/00* (2013.01); *C30B 29/52* (2013.01); *C30B 29/68* (2013.01); *B22F 2999/00* (2013.01); *B33Y 10/00* (2014.12); *B33Y 30/00* (2014.12); *B33Y 70/00* (2014.12)

(56) References Cited

U.S. PATENT DOCUMENTS

| | | |
|---|---|---|
| 5,462,712 A | 10/1995 | Langan et al. |
| 6,024,915 A | 2/2000 | Kume et al. |
| 6,071,628 A | 6/2000 | Seals et al. |
| 6,254,757 B1 | 7/2001 | Lashmore et al. |
| 6,368,427 B1 | 4/2002 | Sigworth |
| 9,238,877 B2 | 1/2016 | Krause et al. |
| 9,415,438 B2 | 8/2016 | McBrien et al. |
| 2002/0136884 A1 | 9/2002 | Oechsner |
| 2003/0077473 A1 | 4/2003 | Bretschneider et al. |
| 2003/0104147 A1 | 6/2003 | Bretschneider et al. |
| 2005/0238528 A1 | 10/2005 | Lin et al. |
| 2006/0065330 A1 | 3/2006 | Cooper et al. |
| 2010/0288243 A1 | 11/2010 | Kaburagi et al. |
| 2012/0135142 A1 | 5/2012 | Yang et al. |
| 2012/0315399 A1 | 12/2012 | Feng et al. |
| 2013/0012643 A1 | 1/2013 | Monsheimer et al. |
| 2013/0146041 A1 | 6/2013 | Hijii et al. |
| 2013/0152739 A1 | 6/2013 | Li et al. |
| 2014/0242687 A1 | 9/2014 | El-Dasher et al. |
| 2015/0252451 A1 | 9/2015 | Al-Aqeeli et al. |
| 2015/0337423 A1 | 11/2015 | Martin et al. |
| 2016/0326880 A1* | 11/2016 | Slavens ............... C30B 29/52 |
| 2017/0016095 A1 | 1/2017 | Karlen et al. |
| 2017/0252851 A1 | 9/2017 | Fulop et al. |
| 2017/0266728 A1* | 9/2017 | Johnson ............... B22D 23/003 |
| 2017/0284208 A1* | 10/2017 | Xu ......................... F01D 5/187 |
| 2018/0036796 A1* | 2/2018 | Mittendorf ........... B05D 3/0254 |
| 2018/0117854 A1 | 5/2018 | Hart et al. |
| 2018/0345369 A1* | 12/2018 | Corsmeier ............. B33Y 10/00 |
| 2019/0070663 A1* | 3/2019 | Corsmeier ............. B33Y 50/02 |
| 2019/0118253 A1* | 4/2019 | Przeslawski ........... C30B 11/14 |

OTHER PUBLICATIONS

Sheppard et al., "The Mechanochemical synthesis of magnesium hydride nanoparticles" Journal of Alloys and Compounds 492 (2010) L72-L74.

Zhu et al., "Growth Mechanism for the Controlled Synthesis of MgH2/Mg Crystals via a Vapor-Solid Process" Cryst. Growth Des. 2011, 11, 4166-4174.

Högberg et al., "Reactive sputtering of δ—ZrH2 thin films by high power impulse magnetron sputtering and direct current magnetron sputtering," Journal of Vacuum Science & Technology A 2014, 32, 041510.

Gharatloo et al., "Ultrasound-assisted synthesis of nano-structured zirconium hydride at room temperature," International Journal of Hydrogen Energy 40 (2015) 13942-13948.

Mukherjee et al., "Printability of alloys for additive manufacturing" Scientific Reports | 6:19717 | DOI: 10.1038/srep19717, Jan. 22, 2016.

He et al., "Alloying element vaporization during laser spot welding of stainless steel" J. Phys. D: Appl. Phys. 36 (2003) 3079-3088.

Bartkowiak et al., "New Developments of Laser Processing Aluminium Alloys via Additive Manufacturing Technique" Physics Procedia 12 (2011) 393-401.

Zhang et al., "Grain Refinement and Mechanical Properties of Cu—Cr—Zr Alloys with Different Nano-Sized TiCp Addition" Materials 2017, 10, 919; doi:10.3390/ma10080919.

Roberts et al., "A novel processing approach for additive manufacturing of commercial aluminum alloys" Physics Procedia 83 ( 2016 ) 909-917.

Martin et al., "3D printing of high-strength aluminium alloys" Nature, vol. 549, Sep. 21, 2017.

Doi et al., "Gamma/Gamma-Prime Microstructure Formed by Phase Separation of Gamma-Prime Precipitates in a Ni—Al—Ti Alloy" Superalloys 2004, TMS (The Minerals, Metals & Materials Society), 2004.

Henderson et al., "Nickel based superalloy welding practices for industrial gas turbine applications", Science and Technology of Welding and Joining, 9:1, 13-21, 2004.

Swanson, "Effect of Crystal Orientation on Analysis of Single-Crystal, Nickel-Based Turbine Blade Superalloys" NASA TP-2000-210074, Feb. 2000.

Korner et al., "Microstructure and Mechanical Properties of CMSX-4 Single Crystals Prepared by Additive Manufacturing", Metallurgical and Materials Transactions A, vol. 49A, Sep. 2018, 3781.

Basak, "Advanced powder bed fusion-based additivemanufacturing with turbine engine hot-section alloysthrough scanning laser epitaxy", Georgia Institute of Technology Ph.D. Dissertation, 2017 (abstract) [dissertation is downloadable via https://smartech.gatech.edu/bitstream/handle/1853/59230/BASAK-DISSERTATION-2017.pdf?sequence=1&isAllowed=y].

* cited by examiner

US 11,865,641 B1

ADDITIVELY MANUFACTURED SINGLE-CRYSTAL METALLIC COMPONENTS, AND METHODS FOR PRODUCING THE SAME

PRIORITY DATA

This patent application is a non-provisional application with priority to U.S. Provisional Patent App. No. 62/741,023, filed on Oct. 4, 2018, which is hereby incorporated by reference herein.

FIELD OF THE INVENTION

The present invention generally relates to additive manufacturing of single-crystal metallic components.

BACKGROUND OF THE INVENTION

Metal-based additive manufacturing, or three-dimensional (3D) printing, has applications in many industries, including the aerospace and automotive industries. Building up metal components layer-by-layer increases design freedom and manufacturing flexibility, thereby enabling complex geometries while eliminating traditional economy-of-scale constraints.

Additive manufacturing allows for one-step fabrication of complex parts of arbitrary design. Additive manufacturing eliminates the need for assembling multiple components or setting up new equipment, while minimizing manufacturing time and wastage of materials and energy. Although additive manufacturing is rapidly growing to produce metallic, polymeric, and ceramic components, production of metallic parts is its fastest growing sector.

During additive manufacturing, a direct energy source locally melts metal alloy powders or wires and builds up a part layer by layer. During this process, uncontrolled thermal gradients and solidification velocities result in a mixture of equiaxed grains, columnar grains, or a mixture of the two. While these polycrystalline microstructures have important applications in many conventional metals, there is a desire for single-crystal alloys from additive manufacturing.

Single crystals of metals or metal alloys provide high strength and low thermal creep (since grain-boundary sliding is absent). Generally speaking, single crystals may provide beneficial mechanical, thermal, electrical, and/or magnetic properties, compared to polycrystalline components.

No publicly available information indicates that single-crystal additive manufacturing is possible for arbitrary geometries. Repair of single-crystal turbine blades has been demonstrated, but due to lack of geometric control, such repair is not considered to be 3D printing (see Basak, "Advanced Powder Bed Fusion-Based Additive Manufacturing with Turbine Engine Hot-Section Alloys through Scanning Laser Epitaxy", Ph.D. Dissertation, Georgia Institute of Technology, December 2017). U.S. Pat. No. 9,415,438 issued Aug. 16, 2016 to McBrien et al. describes a method of forming single-crystal components. However, McBrien's method actually entails first additively manufacturing a polycrystalline component in a ceramic casting, and then remelting and resolidifying the metal to form a single crystal. A single crystal is not explicitly produced via additive manufacturing. McBrien et al. even state in their background that "an inherent feature of metal parts fabricated by additive manufacturing is that the microstructures are polycrystalline."

Single-crystal, nickel-based superalloys are produced today, but they are cast rather than additively manufactured. Nickel-based superalloys contain at least Ni, Al, and Ti. Most nickel-based superalloys also contain Cr, Co, and small amounts of B, Zr, and C. Other potential elements in the nickel-based superalloys are Mo, W, Ta, Hf, and Nb. Increasingly, there is a requirement for high-integrity, defect-free (or limited defects) advanced nickel alloys such as those used for directionally solidified and single-crystal castings (e.g., MAR-M-247 superalloy). Nickel-based superalloys are used, for example, in the manufacture of a wide range of hot-gas-path components such as discs, casings, stator vane segments, and turbine blades.

There is a desire for single-crystal metallic components in various industries, including aviation, automotive, and military. What is sought is a method to additively manufacture single-crystal metals or metal alloys of arbitrary composition and orientation, products produced by such a method. Single-crystal metallic components may include turbine blades, discs, casings, stator vane segments, metallic conductors, semiconductors, and materials for nonlinear optics or apochromatic refracting telescopes, for example.

SUMMARY OF THE INVENTION

The present invention addresses the aforementioned needs in the art, as will now be summarized and then further described in detail below.

Some variations provide a method of making an additively manufactured single-crystal metallic component, the method comprising:
  (a) providing a metal-containing feedstock comprising a first metal or metal alloy;
  (b) providing a build plate comprising a build region consisting of a seed single crystal of a second metal or metal alloy;
  (c) exposing a first amount of the metal-containing feedstock to an energy source for melting the first amount of the metal-containing feedstock, thereby generating a first melt layer disposed on the build region; and
  (d) solidifying the first melt layer, thereby generating a first solid layer, disposed on the build region, of an additively manufactured metal component, wherein the first solid layer is a single crystal of the first metal or metal alloy.

In some embodiments, the metal-containing feedstock is a metal alloy, such as a nickel alloy (e.g., MAR-M-247 or CM-247-LC). In some embodiments, the metal alloy in the metal-containing feedstock is a cobalt alloy, optionally containing Al, Cr, Re, Ni, W, or a combination thereof. The metal-containing feedstock may be in the form of a powder with an average particle size from about 5 microns to about 150 microns, for example.

In some embodiments, the first metal or metal alloy (in the metal-containing feedstock) is the same as said second metal or metal alloy (in the build plate). In other embodiments, the first metal or metal alloy is different than the second metal or metal alloy. In certain embodiments, the first metal or metal alloy is a metal alloy (e.g. nickel alloy), and the second metal or metal alloy is a pure metal (e.g., nickel) that is the same primary element as in the metal-containing feedstock.

The seed single crystal in the build plate may be in a crystal orientation selected from crystal lattice planes (100), (110), (111), or an angle between two of the crystal lattice planes (100), (110), and (111). In some embodiments, the build plate comprises an exterior layer that consists of the seed single crystal of the second metal or metal alloy. In certain embodiments, the build plate consists of the seed single crystal.

The energy source may be a laser-diode energy source, such as one configured with a laser energy density from 10 J/mm$^3$ to 2000 J/mm$^3$, for example.

Step (c) may utilize an exposure time from 1 microsecond to 1 minute, for example. Step (c) may be controlled to maintain an average thermal gradient from 10 K/m to 10$^6$ K/m within the first melt layer and/or within additional melt layers. In some embodiments, the average thermal gradient is below 10$^5$ K/m or below 10$^3$ K/m within the first melt layer and/or within additional melt layers.

Step (d) may be controlled to maintain an average thermal gradient below 10$^6$ K/m (in magnitude) within the first solid layer and/or within additional solid layers. Step (d) may be controlled to maintain an average thermal gradient from 10 K/m to 10$^6$ K/m within the first solid layer and/or within additional solid layers. In some embodiments, the average thermal gradient is below 10$^5$ K/m or below 10$^3$ K/m within the first solid layer and/or within additional solid layers.

Step (d) may be controlled to maintain an average solidification velocity from 10$^{-7}$ m/s to 1 m/s within the first solid layer and/or within additional solid layers. In some embodiments, the average solidification velocity is below 0.1 m/s or below 0.001 m/s within the first solid layer and/or within additional solid layers.

In some embodiments, step (c) utilizes a controlled exposure pattern that spatially constrains solidification in step (d). For example, the controlled exposure pattern may be configured for solidification from one edge of a melt layer, such as the first melt layer, to a distal edge of the melt layer. In some embodiments, the controlled exposure pattern is configured for radial solidification inward from outer edges of a melt layer, such as the first melt layer.

The first solid layer may have a thickness from 10 microns to 500 microns, for example. In some embodiments, the first solid layer is in a crystal orientation selected from crystal lattice planes (100), (110), (111), or an angle between two of the crystal lattice planes (100), (110), and (111).

The method may further comprise repeating steps (b) and (c) a plurality of times to generate a plurality of solid layers by sequentially solidifying a plurality of melt layers in an additive-manufacturing build direction, wherein the plurality of solid layers is a final single crystal of the first metal or metal alloy. The plurality of solid layers may have an average thickness from 10 microns to 500 microns.

In certain embodiments, the seed single crystal and the final single crystal form one continuous crystal.

One or more additive-manufacturing support structures may additionally be fabricated from a plurality of the solid layers. The support structure(s), like the build plate (usually), will ultimately be removed for recovery of the single-crystal metallic component. The support structure(s) may form one continuous crystal with the seed single crystal and the final single crystal.

The final single crystal may be in a crystal orientation selected from crystal lattice planes (100), (110), (111), or an angle between two of the crystal lattice planes (100), (110), and (111). In some embodiments, the final single crystal has a crystal orientation that changes along the additive-manufacturing build direction.

The method may further include recovering the final single crystal of the first metal or metal alloy as an additively manufactured single-crystal metallic component. For example, the build plate may be removed by cutting or selective melting.

Some variations of the invention provide an additively manufactured single-crystal metallic component produced by a process comprising:
(a) providing a metal-containing feedstock comprising a first metal or metal alloy;
(b) providing a build plate comprising a build region consisting of a seed single crystal of a second metal or metal alloy;
(c) exposing a first amount of the metal-containing feedstock to an energy source for melting the first amount of the metal-containing feedstock, thereby generating a first melt layer disposed on the build region;
(d) solidifying the first melt layer, thereby generating a first solid layer, disposed on the build region, of an additively manufactured metal component, wherein the first solid layer is a single crystal of the first metal or metal alloy;
(e) repeating steps (b) and (c) a plurality of times to generate a plurality of solid layers by sequentially solidifying a plurality of melt layers in an additive-manufacturing build direction, wherein the plurality of solid layers is a final single crystal of the first metal or metal alloy; and
(f) recovering the final single crystal of the first metal or metal alloy as an additively manufactured single-crystal metallic component, preferably with a continuous crystallographic texture.

In some embodiments, the final single crystal is in a crystal orientation that is different from (100). In some embodiments, the final single crystal has a crystal orientation that varies along the additive-manufacturing build direction.

Some variations of the invention provide a single-crystal metallic article comprising:
(a) a build plate comprising a build region consisting of a seed single crystal of a second metal or metal alloy; and
(b) a plurality of solid layers forming a component single crystal of a first metal or metal alloy, wherein the component single crystal is disposed on the build region,
wherein the build region and the plurality of solid layers form a continuous crystallographic texture.

The plurality of solid layers may have an average thickness from 10 microns to 500 microns.

In some embodiments, the first and/or second metal or metal alloy is a nickel alloy, wherein the nickel alloy optionally contains Al, Cr, Re, Co, W, or a combination thereof. In some embodiments, the first and/or second metal or metal alloy is a cobalt alloy, wherein the cobalt alloy optionally contains Al, Cr, Re, Ni, W, or a combination thereof.

In some embodiments, the build plate comprises an exterior layer that consists of the seed single crystal of the second metal or metal alloy. In certain embodiments, the build plate consists of the seed single crystal.

The seed single crystal may be in a crystal orientation selected from crystal lattice planes (100), (110), (111), or an angle between two of the crystal lattice planes (100), (110), and (111). The component single crystal may be in one or more crystal orientations selected from crystal lattice planes (100), (110), (111), or an angle between two of the crystal lattice planes (100), (110), and (111). In some embodiments, the seed single crystal and the component single crystal form one continuous crystal.

The single-crystal metallic article may be produced via additive manufacturing in an additive-manufacturing build direction. The final single crystal may have a crystal orientation that varies along the additive-manufacturing build direction.

Some variations provide a single-crystal metallic component comprising a plurality of solid layers in an additive-manufacturing build direction, wherein the plurality of solid layers forms a component single crystal of a metal or metal alloy with a continuous crystallographic texture, and wherein optionally the component single crystal has a crystal orientation that varies along the additive-manufacturing build direction. The plurality of solid layers may have an average thickness from 10 microns to 500 microns.

In some embodiments, the component single crystal, on local length scales of 100 μm along the additive-manufacturing build direction, contains crystallographic misorientations that are less than 5 degrees on average.

In some embodiments, the component single crystal is in one or more crystal orientations selected from crystal lattice planes (100), (110), (111), or an angle between two of the crystal lattice planes (100), (110), and (111).

The single-crystal metallic component does not typically contain the build plate, which is usually removed after fabrication. However, the use of a single-crystal build plate (rather than a polycrystalline build plate) will be detectible in the single-crystal metallic component, by examining the surface(s) that were previously connected to the build plate. In particular, the component single crystal provided herein preferably does not have a crystallographic discontinuity at a surface arising from removal of a build plate.

The first metal or metal alloy, in the single-crystal metallic component, may be a nickel alloy and/or a cobalt alloy, for example. An exemplary single-crystal metallic component is a turbine blade.

Other variations of the invention provide an additive-manufacturing build plate comprising a build region consisting of a single crystal of a metal or metal alloy (e.g., a nickel alloy or a cobalt alloy). The single crystal in the build plate may be in a crystal orientation selected from crystal lattice planes (100), (110), (111), or an angle between two of the crystal lattice planes (100), (110), and (111). In some embodiments, the build plate comprises an exterior layer that consists of a single crystal of the metal or metal alloy. In certain embodiments, the build plate consists of a single crystal of the metal or metal alloy.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION OF EMBODIMENTS OF THE INVENTION

Figure 1:
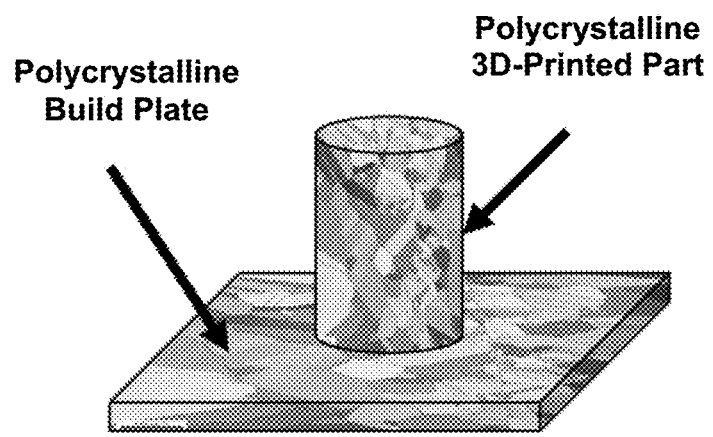
FIG. 1 shows an additive manufacturing microstructure and an inverse pole figure (IPF) triangle indicating crystal orientations by color, revealing an equiaxed build, in conventional additive manufacturing.
Figure 1:
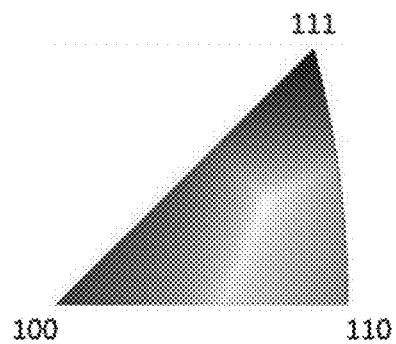

The methods, materials, structures, and systems of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms, except when used in Markush groups. Thus in some embodiments not otherwise explicitly recited, any instance of "comprising" may be replaced by "consisting of" or, alternatively, by "consisting essentially of."

The present invention provides a method to additively manufacture single-crystal metals and metal alloys of arbitrary composition and orientation. The invention, in some variations, is predicated on the use of a targeted crystallographic build-plate material for additive manufacturing, as well as control of the crystallographic growth front during additive manufacturing, to produce an epitaxial single crystal.

This invention applies to many commercial applications. The invention enables the production of additively manufactured single-crystal metal alloys that are commonly used in turbine applications and other high-temperature or creep-resistant applications in which the presence of grain boundaries may be deleterious to material performance.

Some variations provide a method of making an additively manufactured single-crystal metallic component, the method comprising:
(a) providing a metal-containing feedstock comprising a first metal or metal alloy;
(b) providing a build plate comprising a build region consisting of a seed single crystal of a second metal or metal alloy;
(c) exposing a first amount of the metal-containing feedstock to an energy source for melting the first amount of the metal-containing feedstock, thereby generating a first melt layer disposed on the build region; and
(d) solidifying the first melt layer, thereby generating a first solid layer, disposed on the build region, of an additively manufactured metal component, wherein the first solid layer is a single crystal of the first metal or metal alloy.

Figure 9:
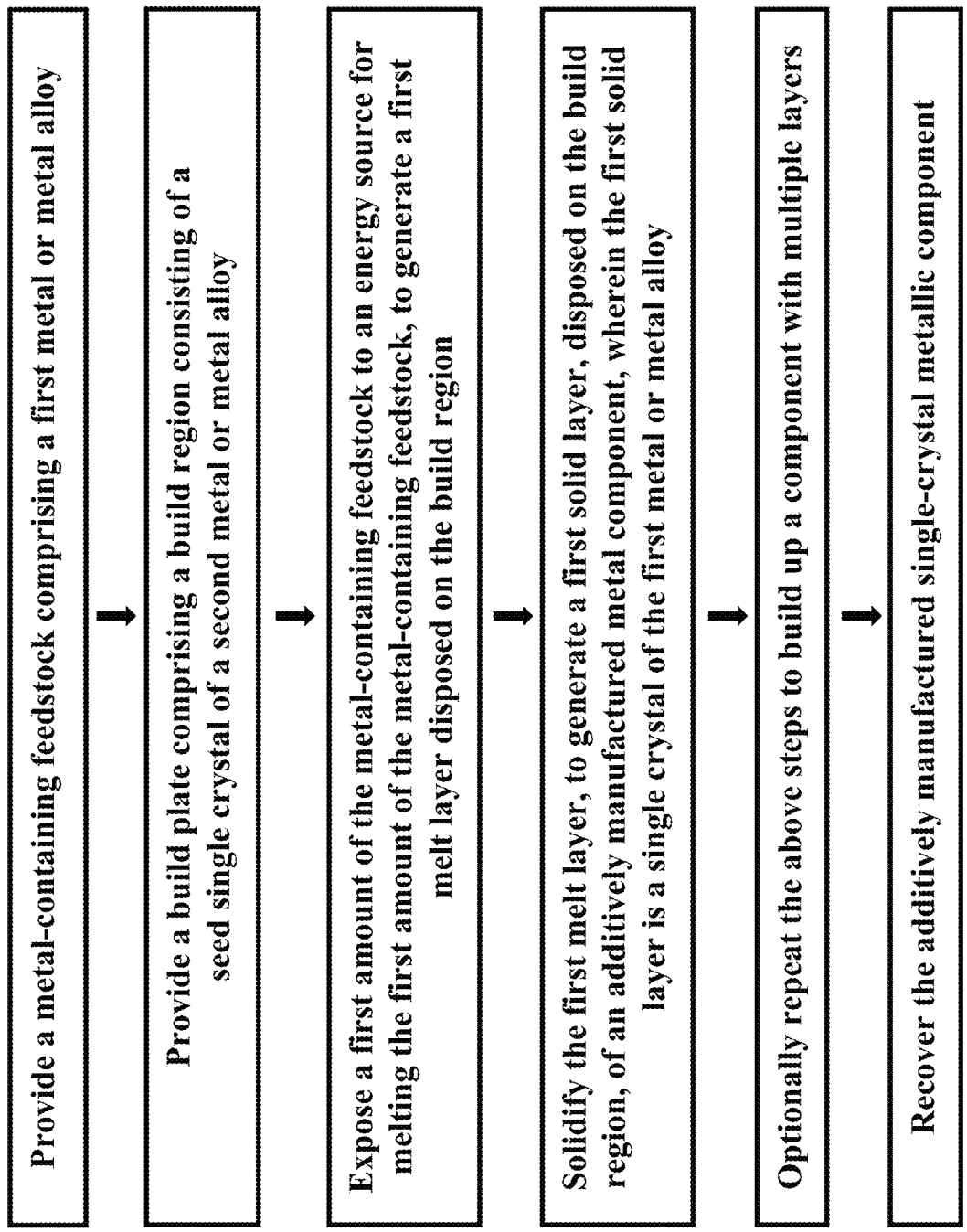
FIG. 9 is an exemplary flowchart of a method making an additively manufactured single-crystal metallic component, in some embodiments.

FIG. 9 is an exemplary flowchart of a method making an additively manufactured single-crystal metallic component, in some embodiments.

In some embodiments, the metal-containing feedstock is a metal alloy, such as a nickel alloy (e.g., MAR-M-247 or CM-247-LC). In some embodiments, the metal alloy is a cobalt alloy, optionally containing Al, Cr, Re, Ni, W, or a combination thereof. Other examples of metal alloys are Inconel Alloy 625 and Inconel Alloy 718.

In general, the metal-containing feedstock may contain one or more alloying elements selected from the group consisting of H, Li, Be, B, C, N, O, F, Na, P, S, Cl, K, Si, Fe, Cu, Mn, Mg, Cr, V, Bi, Pb, Zr, Ca, Sc, Co, Zn, Ga, Ge, As, Se, Br, Rb, Sr, Y, Nb, Mo, Tc, Ru, Rh, Pd, Ag, Cd, In, Sn, Te, I, Cs, Ba, Hf, Ta, W, Re, Os, Ir, Pt, Au, Hg, Tl, Ce, Nd, and combinations thereof.

In the context of this disclosure, "feedstock" is meant to include any powder or other geometric form which may be used for additive manufacturing. In general, the geometry of the feedstock is not limited and may be, for example, in the form of powder particles, wires, rods, bars, plates, films, coils, spheres, cubes, prisms, cones, irregular shapes, or combinations thereof. In certain embodiments, the feedstock is in the form of a powder, a wire, or a combination thereof (e.g., a wire with powder on the surface).

The feedstock may be of any compatible size for common or custom additive manufacturing equipment. When the feedstock is in the form of powder, the powder particles may have an average diameter from about 1 micron to about 500 microns, such as about 10 microns to about 100 microns, for example. When the feedstock is in the form of a wire, the wire may have an average diameter from about 10 microns to about 1000 microns, such as about 50 microns to about 500 microns, for example.

A powdered feedstock may be in any form in which discrete particles can be reasonably distinguished from each other. The powder may be present as loose powders, a paste, a suspension, or a green body, for example. A green body is an object whose main constituent is weakly bound powder material, before it has been melted and solidified.

In some embodiments, the metal-containing feedstock may be in the form of a powder with an average particle size from about 5 microns to about 150 microns, for example. In some embodiments, the average particle size is about 10, 20, 30, 40, 50, 60, 70, 80, 90, or 100 microns.

Particles sizes may be measured by a variety of techniques, including dynamic light scattering, laser diffraction, image analysis, or sieve separation, for example. Dynamic light scattering is a non-invasive, well-established technique for measuring the size and size distribution of particles typically in the submicron region, and with the latest technology down to 1 nanometer. Laser diffraction is a widely used particle-sizing technique for materials ranging from hundreds of nanometers up to several millimeters in size. Exemplary dynamic light scattering instruments and laser diffraction instruments for measuring particle sizes are available from Malvern Instruments Ltd., Worcestershire, UK. Image analysis to estimate particle sizes and distributions can be done directly on photomicrographs, scanning electron micrographs, or other images.

By "component" it is meant any object that is additively manufactured, with arbitrary geometry and size. During additive manufacturing, material is deposited layer by layer to build up a part of arbitrary geometry. Conventional processing such as casting or machining is limited by process-specific design criteria or line-of-sight manufacturing, which restricts the potential geometries. Additive manufacturing overcomes these limitations by starting with powder or wire material at a finer scale than the target geometries being built, and locally melting or sintering these materials together to build the component from the ground up. In principle, any geometry can be created.

A "build plate" is a component that contains a "build region," which in turn is an initial solid substrate onto which a first layer is additively manufactured. The solid substrate may be a two-dimensional plate, but that is not necessarily the case. The solid substrate may be a two-dimensional platform, a three-dimensional platform or template, or another region of material having an exposed surface onto which layers may be deposited during additive manufacturing. In the case of a three-dimensional template, it is in principle possible to grow the component inward from an inner surface (build region), if the template material is transparent to the laser beam or other energy source.

The build region may form the entire build plate, or there may be other elements within the build plate, besides the selected second metal or metal alloy in the build region. For example, a build plate may include a base plate composed of solid metal, such as stainless steel. The build plate may be of any dimension and/or thickness depending upon the desired object to be built thereon. In some embodiments, the build plate may be about the same size as a machine build platform. The build region itself may have a thickness from about 1 μm to about 1 cm, such as about 10 μm, 50 μm, 100 μm, 200 μm, 500 μm, 1 mm, 5 mm, 1 cm, or more. The build region may have a diameter, or other length scale perpendicular to thickness, from about 10 μm to about 10 cm, such as about 25 μm, 50 μm, 100 μm, 200 μm, 500 μm, 1 mm, 5 mm, 1 cm, 5 cm, or more. Build-region recesses may be formed into the build plate, if desired, using any suitable material removal process including, but not limited to, milling, grinding, cutting, blasting, and the like.

Figure 2:
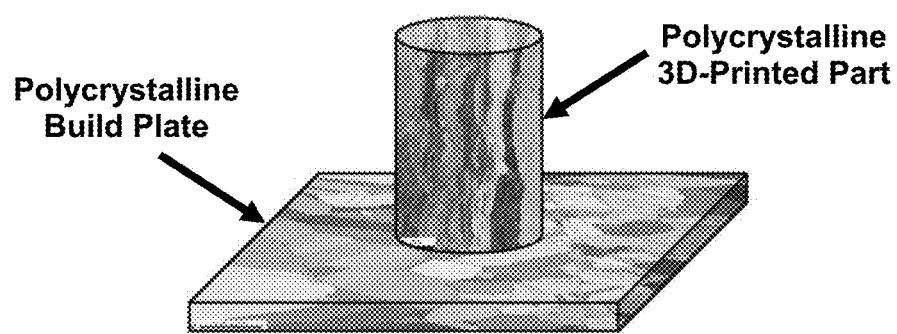
FIG. 2 shows an additive manufacturing microstructure and an inverse pole figure (IPF) triangle indicating crystal orientations by color, revealing a columnar build, in conventional additive manufacturing.
Figure 2:
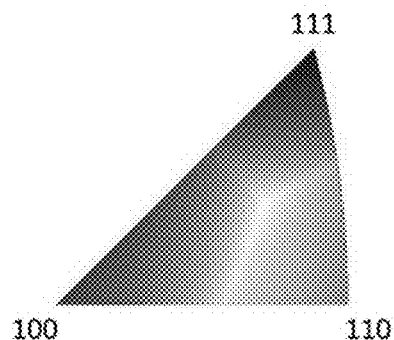

A conventional additive-manufacturing process utilizing a polycrystalline build plate and a series of 2D images will result in two possible microstructures that are typical of additive manufacturing prior to the present invention. FIG. 1 shows an additive manufacturing microstructure and an inverse pole figure (IPF) triangle indicating crystal orientations by color, revealing an equiaxed build. FIG. 2 shows an additive manufacturing microstructure and an IPF triangle, revealing a columnar build. As shown in FIGS. 1 and 2, equiaxed and/or columnar grains can be produced, but due to the initial build off of a polycrystalline build plate, multiple crystals are seeded and there is never a convergence to a single-crystal component. The component is therefore polycrystalline.

The use of a single-crystal build plate—or a single-crystal build region within a build plate—can overcome this problem and instead produce a single-crystal component.

A perfect single crystal is a material in which the crystal lattice of the entire sample is continuous and unbroken to the edges of the sample, with no grain boundaries. Theoretically perfect single crystals are not necessary in this invention. There may be some degree of crystallographic misorientation. An angle of misorientation between two texture components herein is calculated as an Euler angle. If the two texture components have exactly the same crystal orientation, the angle of misorientation is zero degrees. If two texture components have a similar crystal orientation such that the angle of misorientation is low enough (as defined below), then the two texture components will be regarded as forming one single crystal, for purposes of this disclosure.

In some embodiments, a "single crystal" means a region of metal or metal alloy for which the average angle of misorientation is less than 5 degrees, calculated as an average over all crystal unit cells present in the region of material. Preferably, the average angle of misorientation is less than 4, 3, 2, 1, 0.5, 0.4, 0.3, 0.2, or 0.1 degrees.

In some embodiments, on a length scale of 100 μm of the metal or metal alloy, the average angle of local misorientation is less than 5 degrees, calculated as an average over all crystal unit cells present in the region of local material defined by the length scale. In various embodiments, the average angle of local misorientation is less than 5, 4, 3, 2, 1, 0.5, 0.4, 0.3, 0.2, or 0.1 degrees on a length scale of 10, 25, 50, 75, 100, 150, 200, 250, 300, 400, or 500 μm of the metal or metal alloy. The length scale can be in the additive-manufacturing build direction or can be perpendicular to that direction, for example. The length scale can be the same as the additive-manufacturing layer thickness. It is noted that local misorientation is distinct from macroscale misorientation. For example, in FIG. 6, macroscale (intergranular) misorientation is intentionally introduced by turning the orientation of the crystal. When such macroscale misorientation is present, however, it is still possible and preferred that the average angle of local misorientation is less than 5 degrees on a length scale of 10 microns or another length scale defined by local grain boundaries.

A "crystal lattice plane" is a lattice plane determined by three integers h, k, and 1, known as the Miller indices, written as (hkl). The notation {hkl} denotes the set of all planes that are equivalent to (hkl) by the symmetry of the lattice. In this disclosure, any reference to (100), (111), etc. also includes reference to {100}, {111}, etc.

In the context of crystal directions (not planes), [hkl] denotes a direction in the basis of the direct lattice vectors instead of the reciprocal lattice, and <hkl> denotes the set of all directions that are equivalent to [hkl] by symmetry. In this disclosure, any reference to [100], [111], etc. also includes reference to <100>, <111>, etc.

Figure 3:
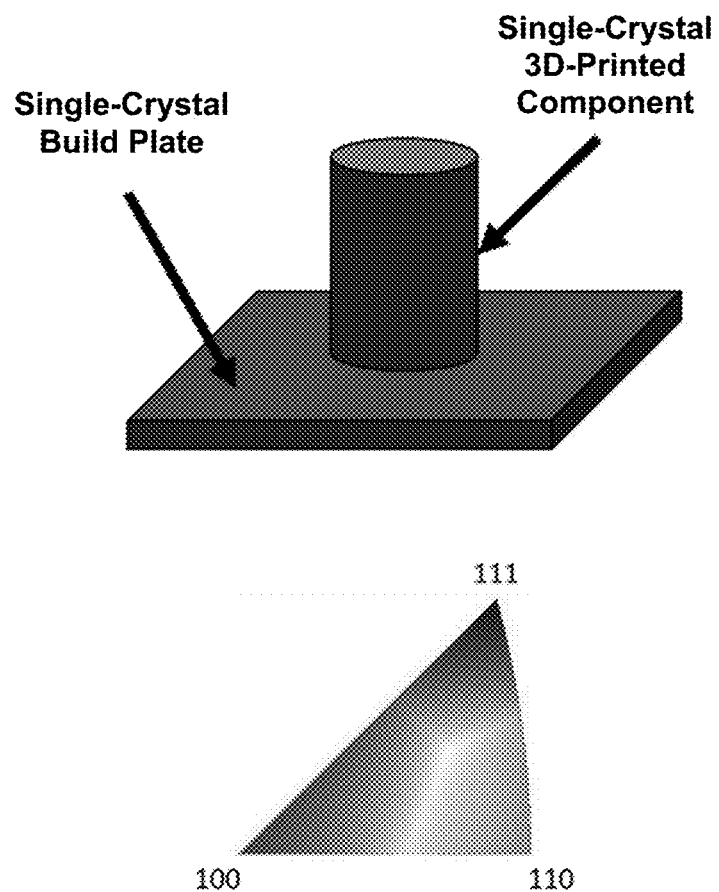
FIG. 3 shows an additive manufacturing microstructure and an inverse pole figure (IPF) triangle indicating crystal orientations by color, revealing a single-crystal build in the crystal lattice plane (111) orientation, in some embodiments.
Figure 4:
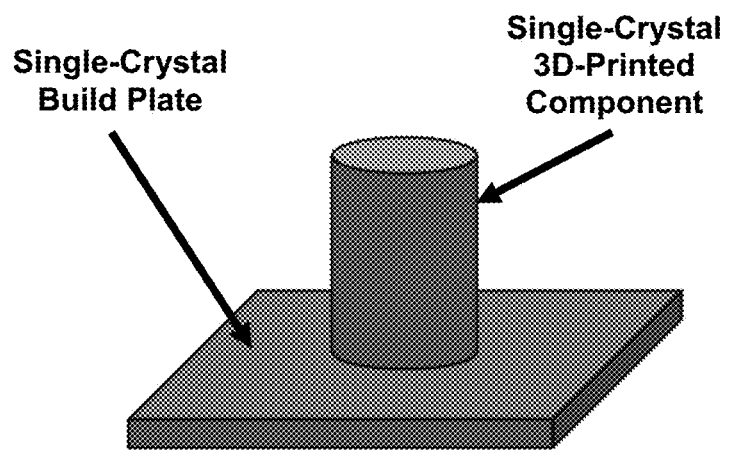
FIG. 4 shows an additive manufacturing microstructure and an inverse pole figure (IPF) triangle indicating crystal orientations by color, revealing a single-crystal build in the crystal lattice plane (100) orientation, in some embodiments.
Figure 4:
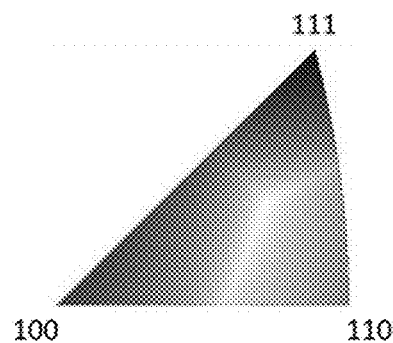
Figure 5:
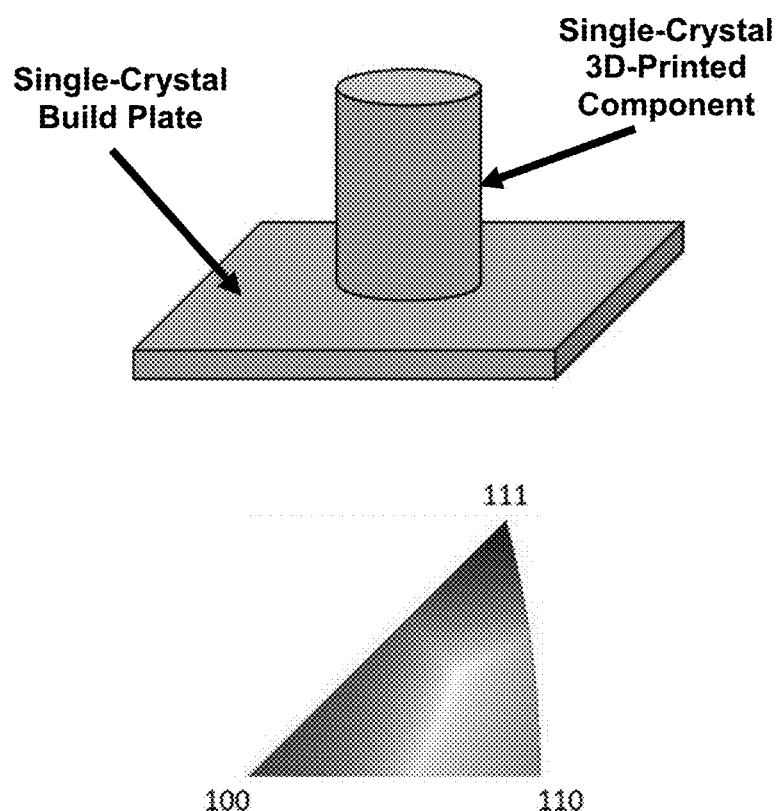
FIG. 5 shows an additive manufacturing microstructure and an inverse pole figure (IPF) triangle indicating crystal orientations by color, revealing a single-crystal build in the crystal lattice plane (110) orientation, in some embodiments.
Figure 6:
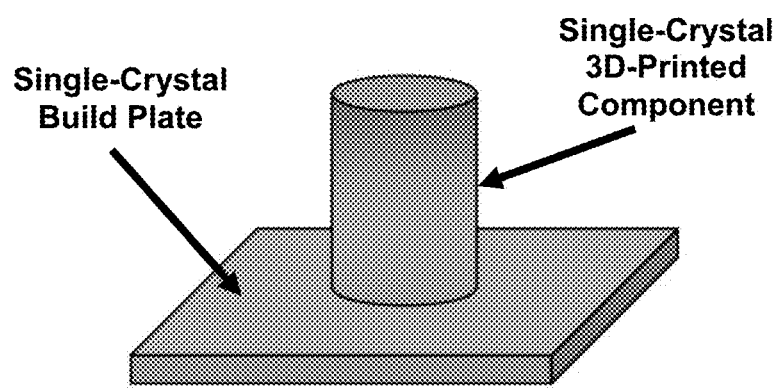
FIG. 6 shows an additive manufacturing microstructure and an inverse pole figure (IPF) triangle indicating crystal orientations by color, revealing a single-crystal build with through-height bi-orientation via gradual change in growth orientation, in certain embodiments.
Figure 6:
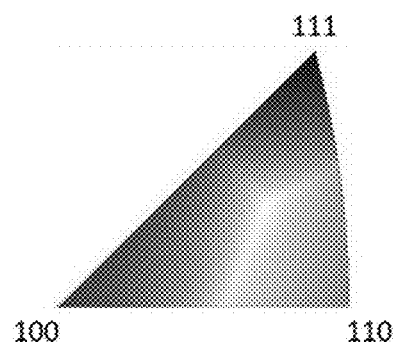
Figure 7:
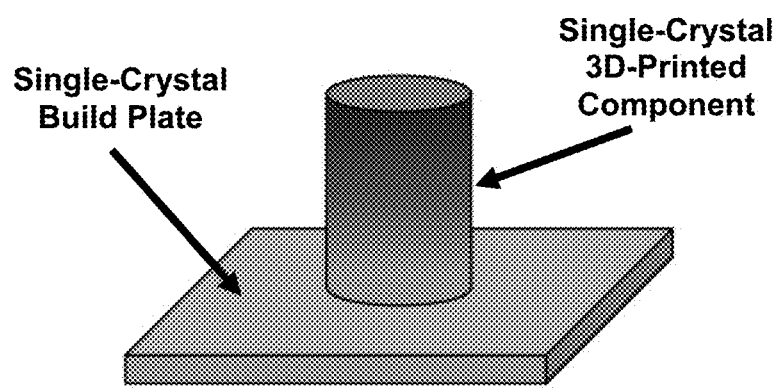
FIG. 7 shows an additive manufacturing microstructure and an inverse pole figure (IPF) triangle indicating crystal orientations by color, revealing a single-crystal build with through-height tri-orientation via gradual change in growth orientation, in certain embodiments.
Figure 7:
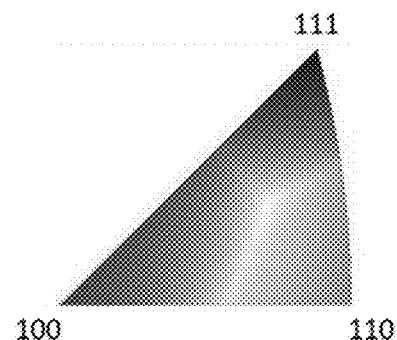

FIG. 3 shows an additive manufacturing microstructure and an inverse pole figure (IPF) triangle indicating crystal orientations by color, revealing a single-crystal build in the crystal lattice plane (111) orientation. FIG. 4 shows an additive manufacturing microstructure and an IPF triangle, revealing a single-crystal build in the crystal lattice plane (100) orientation. FIG. 5 shows an additive manufacturing microstructure and an IPF triangle, revealing a single-crystal build in the crystal lattice plane (110) orientation. FIG. 6 shows an additive manufacturing microstructure and an IPF triangle, revealing a single-crystal build with through-height bi-orientation via gradual change in growth orientation. FIG. 7 shows an additive manufacturing microstructure and an IPF triangle, revealing a single-crystal build with through-height tri-orientation via gradual change in growth orientation.

As shown in FIGS. 3 to 7, multiple different crystallographic orientations are possible, depending on the original seed orientation of the build region of the build plate. This is a significant benefit for many metal alloys that have anisotropic elastic constants. For example, single-crystal turbine blades have a dominant (100) crystal orientation because [100] is the preferential growth direction of FCC nickel. Due to the limits of the conventional casting process, the growth direction [100] is always vertical along the blade direction. The crystal growth direction [100] is weaker than the [110] or [111] directions which would be preferential, but would require extremely complex casting procedures to account for stray grain formation and geometric issues.

The present disclosure overcomes the prior geometric and casting constraints and allows for crystal growth in any selected direction. A single-crystal build region seeds the formation of a single-crystal component. Through a layer-by-layer approach in additive manufacturing, the growth may be induced in a controlled manner with selected thermal gradients and solidification velocities, as further described below. The controlled thermal gradients and solidification velocities may also be used to induce controlled local misorientations without producing a new grain boundary, to systematically twist the growing crystal to different orientations throughout the height of the build—or possibly within the XY direction (perpendicular to the build direction)—to provide variable stiffness to the additively manufactured part while maintaining the creep and strength benefits of a single crystal.

The seed single crystal in the build plate may be in a crystal orientation selected from crystal lattice planes (100), (110), (111), or an angle between two of the crystal lattice planes (100), (110), and (111).

In some embodiments, the build plate comprises an exterior layer that consists of the seed single crystal of the second metal or metal alloy. In some embodiments, the build plate comprises an interior build region in the shape of a circle, square, or other geometry, with at least one exposed surface capable of seeding crystal growth during layer formation. In some embodiments, the build plate comprises multiple interior build regions each with an exposed surface capable of seeding crystal growth during layer formation. The build plate may be three-dimensional, such as a sphere, cube, or cuboid, with one or more surfaces (or the entire surface) capable of seeding crystal growth during layer formation. In certain embodiments, the build plate consists of the seed single crystal, i.e., the entire build plate (of arbitrary geometry) is a single crystal.

In some embodiments, the build plate is formed by conventional metal or metal alloy casting. In some embodiments, the build plate is obtained from another source, with a specification that the build plate is or contains a single crystal of a metal or metal alloy. The build plate, or a portion thereof, may itself be additively manufactured, in a separate procedure. However, there is again the challenge of preventing a polycrystalline material, unless a single-crystal substrate is provided to make the build plate itself.

In certain embodiments, a first single-crystal build plate is obtained from a conventional source (e.g., a casted plate). Then a large reservoir of build-plate material is additively manufactured, and from this single-crystal reservoir, several single-crystal build plates may be obtained (e.g., by cutting into slices). Each of the additively manufactured, single-crystal build plates may then serve as a starting build plate for making a single-crystal component. This technique may help avoid any interfacial discontinuities between build region and component.

The build plate, or at least the build region, may have the same chemical composition as the intended composition of the component to be built by additive manufacturing. This is referred to as homoepitaxy. In some embodiments, the build region has a different chemical composition than the intended composition of the component to be built by additive manufacturing, which is referred to as heteroepitaxy. In the case of heteroepitaxy, it is preferable to match the crystal orientation of the single-crystal build region with the intended crystal orientation of the first layer and additional layers to be built, even if the chemical species vary, to obtain a continuous crystallographic texture across the interface.

A "continuous crystallographic texture" means that at least the surface of the build region (and preferably the entire depth of the build region), together with at least the first solid layer (and preferably all additional solid layers), have an average angle of misorientation less than 10 degrees, calculated as an average over all crystal unit cells present in the interfacial region of material. Preferably, the average angle of misorientation is less than 9, 8, 7, or 6 degrees, and more preferably less than 5, 4, 3, 2, 1, 0.5, 0.4, 0.3, 0.2, or 0.1 degrees, in the interfacial region of material. The interfacial region of material may have a thickness of about 10, 25, 50, 75, 100, 150, 200, 250, 300, 400, or 500 μm.

In certain embodiments, the seed single crystal (in the build plate) and the final single crystal (the component additively manufactured) form one continuous single crystal. There may be a minor discontinuity at the interface between the build region and the first layer, or there may be no detectable discontinuity, which is preferred. The discontinuity may be in the crystal lattice plane or direction, or in the chemical composition, for example. A minor discontinuity may arise from the presence of impurities on the build region or due to the fabrication technique of the build plate, for example.

Utilizing a single-crystal build plate (or region) is important to ensure that initial and subsequent layers can nucleate and epitaxially grow off of a known crystal orientation without any additional seeded grains. While this is one aspect of the present invention, a controlled exposure pattern is also important, in some variations.

The energy source is preferably a laser-diode energy source, such as one configured with a laser energy density from 10 J/mm$^3$ to 2000 J/mm$^3$. In various embodiments, the laser-diode energy source is configured with a laser energy density of about 10, 50, 100, 200, 300, 400, 500, 600, 700, 800, 900, 1000, 1100, 1200, 1300, 1400, 1500, 1600, 1700, 1800, 1900, or 2000 J/mm$^3$. Laser diodes operate at shorter laser wavelengths (e.g., 808 nm) than conventional fiber lasers (e.g., 1064 nm), enabling more efficient-energy absorption, in some embodiments.

Various energy sources may be utilized (as discussed at the end of this specification), provided the energy source is capable of producing a gradient digital energy pattern. Conventional additive manufacturing utilizes a rastering laser to build parts up layer by layer. A process utilizing a gradient digital energy pattern (e.g., from a laser-diode system) allows a 2D exposure to be projected onto a powder bed to produce a large area melt pool in the shape of the layer which is meant to be built. Use of a gradient digital energy pattern has the advantage of speeding up the additive-manufacturing process. Additionally, a gradient digital energy pattern enables control of the crystallographic texture to produce a single-crystal part.

FIGS. 8A to 8D show potential exposure patterns of a laser diode on a single layer being additively manufactured, which for simplicity of illustration is depicted as a circle. As time progresses (left to right in the diagrams), the material solidifies, denoted as a transition from white to black. This solidification occurs in the first layer as well as additional layers, sequentially, during additive manufacturing.

Figure 8A:
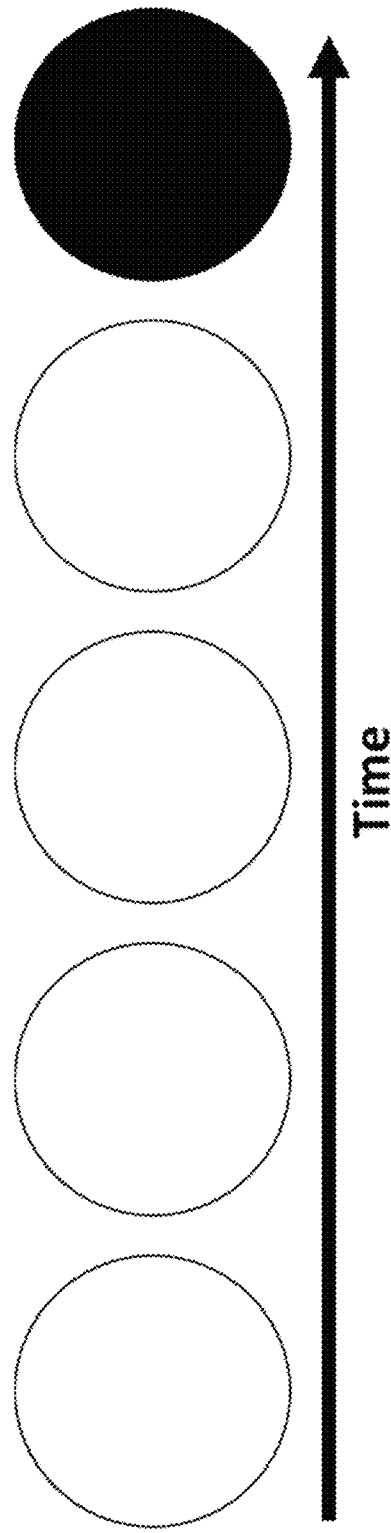
FIG. 8A shows a conventional additive-manufacturing exposure pattern (in space and time) that is uncontrolled and may result in a stochastic solidification mechanism.

FIG. 8A shows a typical exposure pattern (in space and time) that is uncontrolled and may result in a stochastic solidification mechanism, which risks nucleating new grains (i.e. beyond the seed grain in the build region). FIG. 8A may utilize a laser diode which is capable of a gradient digital energy pattern, although the specific exposure pattern in FIG. 8A is not a gradient digital energy pattern.

Figure 8B:
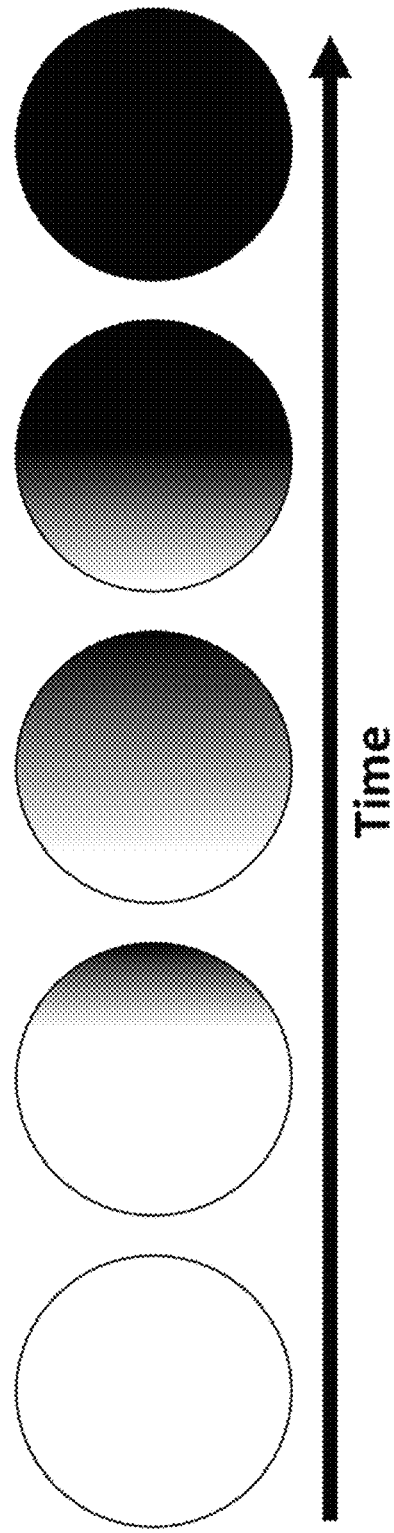
FIG. 8B shows a controlled exposure pattern (in space and time) to induce a solidification front from right to left, in some embodiments of a gradient digital energy pattern during additive manufacturing.
Figure 8C:
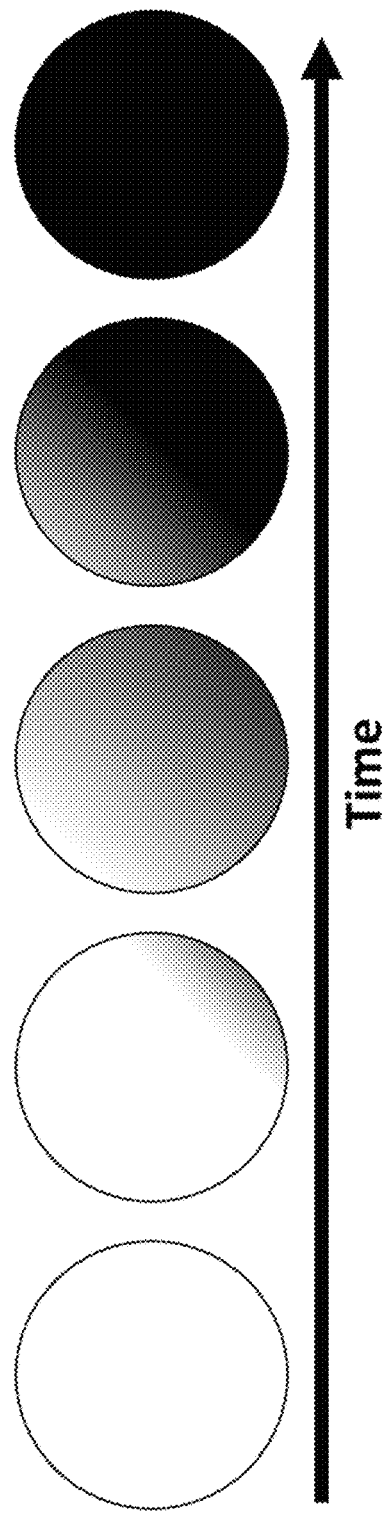
FIG. 8C shows a controlled exposure pattern (in space and time) to induce a solidification front in a direction that is a 45-degree rotation compared to the solidification front of FIG. 8B, in some embodiments of a gradient digital energy pattern during additive manufacturing.
Figure 8D:
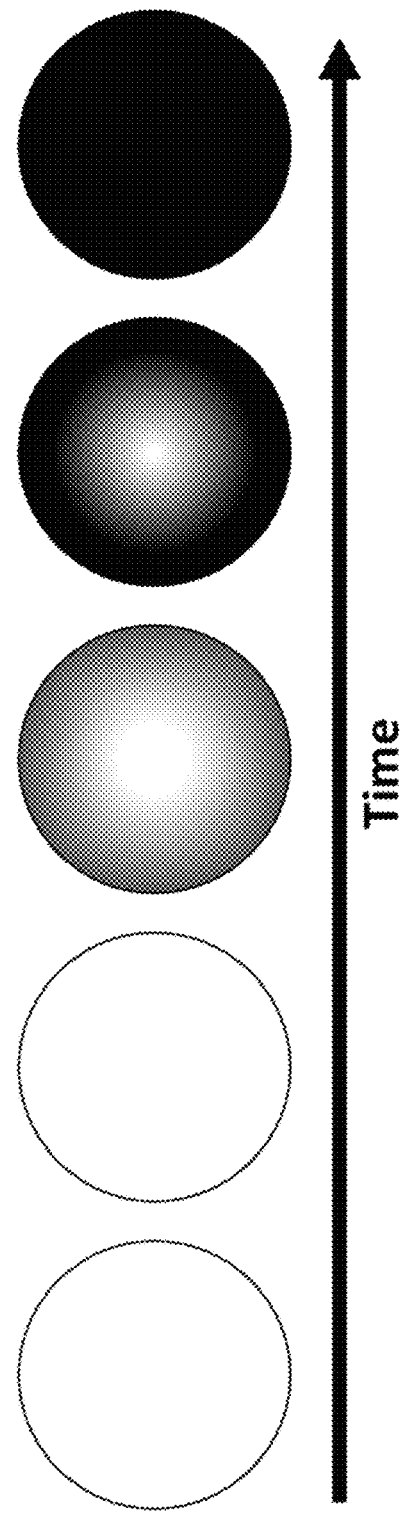
FIG. 8D shows a controlled exposure pattern (in space and time) to induce a radial solidification front, i.e. radially inward solidification from the edges, in some embodiments of a gradient digital energy pattern during additive manufacturing.

FIG. 8B shows a controlled exposure pattern (in space and time) to induce a solidification front from right to left. FIG. 8C shows a controlled exposure pattern (in space and time) to induce a solidification front in a direction that is a 45-degree rotation compared to the solidification front of FIG. 8B. FIG. 8D shows a controlled exposure pattern (in space and time) to induce a radial solidification front, i.e. radially inward solidification from the edges.

FIGS. 8B, 8C, and 8D highlight a few, but by no means all, potential control schemes for the solidification of single crystals. By utilizing a temporally and/or spatially controlled phase-out of the energy source (e.g., a laser diode), thermal gradients and solidification velocities may be controlled.

Also, by utilizing a temporally and/or spatially controlled phase-out of the energy source, the angle of solidification may be adjusted relative to the underlying orientation of the build region or previous layer, thereby inducing changes in the crystallographic orientation. The term "phase-out" refers to selective absence of a laser beam or other energy source, within a region of space or for a certain time.

A temporally controlled phase-out of the energy source may be accomplished by varying power to the energy source, laser pulsing, etc. A spatially controlled phase-out of the energy source may be accomplished with a mask to selectively block some of the energy source, for example. The mask may be configured to be controlled by a processor to electronically enable selected portions of the powder bed to be masked off. A processor may be used for electronically controlling the mask.

In some embodiments, customized arrays of laser-diode emitters are utilized for high-speed processing of metal or metal alloy feedstock. Individually addressable laser-diode emitters may be used to selectively melt feedstock from a powder bed in a spatially controlled manner, to generate potentially large melt pools in the shape of the layer to be fabricated. For purposes of this disclosure, a plurality of individually addressable laser-diode emitters is regarded as providing spatially controlled phase-out of the energy source.

This invention (in some embodiments) utilizes a diode-based additive manufacturing technique, such as one described in U.S. Patent App. Pub. No. 2014/0252687 A1 to El-Dasher et al., which is hereby incorporated by reference herein for its teachings of diode-based additive manufacturing and masking techniques.

The method in step (c) may utilize an exposure time from 1 microsecond to 1 minute, for example. In various embodiments, the exposure time is about 10 microsecond, 100 microseconds, 1 millisecond, 10 milliseconds, 100 milliseconds, 1 second, or 10 seconds. The exposure time may be readily varied by turning on and off the energy source, or by utilizing a spatially controlled phase-out of the energy source, for example.

Step (c) may be controlled to maintain an average thermal gradient from 10 K/m to $10^6$ K/m within the first melt layer and/or additional melt layers, such as about, or less than about, 10, $10^2$, $10^3$, $10^4$, or $10^5$ K/m. In some embodiments, the average thermal gradient is below $10^5$ K/m or below $10^3$ K/m within the first melt layer and/or additional melt layers. In various embodiments, the average thermal gradient in step (c) is from 10 to 100 K/m, or from 10 to $10^3$ K/m, or from 10 to $10^4$ K/m, or from 10 to $10^5$ K/m, for example. The average thermal gradient during melting may be controlled by utilizing a temporally and/or spatially controlled phase-out of the energy source, preferably a spatially controlled phase-out of the energy source.

In some embodiments, the powder bed temperature is from about room temperature (e.g., about 25° C.) to about a temperature that is within 50° C. of the solidus temperature (the highest temperature at which the metal alloy is a solid).

The method in step (d) may be controlled to maintain an average thermal gradient below $10^6$ K/m (in magnitude) within the first solid layer and/or within additional solid layers. Step (d) may be controlled to maintain an average thermal gradient from 10 K/m to $10^6$ K/m within the first solid layer and/or within additional solid layers, such as about, or less than about, 10, $10^2$, $10^3$, $10^4$, or $10^5$ K/m. In some embodiments, the average thermal gradient is below $10^5$ K/m or below $10^3$ K/m within the first solid layer and/or within additional solid layers. In various embodiments, the average thermal gradient in step (d) is from 10 to 100 K/m, or from 10 to $10^3$ K/m, or from 10 to $10^4$ K/m, or from 10 to $10^5$ K/m, for example. The average thermal gradient during solidification may be controlled by utilizing a temporally and/or spatially controlled phase-out of the energy source, preferably a spatially controlled phase-out of the energy source.

Step (d) may be controlled to maintain an average solidification velocity from $10^{-7}$ m/s to 1 m/s within the first solid layer and/or within additional solid layers. In some embodiments, the average solidification velocity is below 0.1 m/s or below 0.001 m/s within the first solid layer and/or within additional solid layers. In various embodiments, the average solidification velocity is about, or less than about, $10^{-6}$, $10^{-5}$, $10^{-4}$, $10^{-3}$, $10^{-2}$, $10^{-1}$, or 1 m/s within the first solid layer and/or within additional solid layers. In various embodiments, the average solidification velocity is from $10^{-7}$ m/s to $10^{-1}$ m/s, or $10^{-7}$ m/s to $10^{-2}$ m/s, or $10^{-7}$ m/s to $10^{-3}$ m/s, or $10^{-7}$ m/s to $10^{-4}$ m/s, for example. The average solidification velocity during solidification may be controlled by utilizing a temporally and/or spatially controlled phase-out of the energy source, preferably a spatially controlled phase-out of the energy source.

In some methods, step (c) utilizes a controlled exposure pattern that spatially constrains solidification in step (d). For example, the controlled exposure pattern may be configured for solidification from one edge of a melt layer to a distal edge of the melt layer (such as depicted in FIGS. 8B and 8C). In some embodiments, the controlled exposure pattern is configured for radial solidification inward from outer edges of a melt layer (such as depicted in FIG. 8D).

The first solid layer may have a thickness from 10 microns to 500 microns, for example. Additional solid layers may have an average thickness from 10 microns to 500 microns, for example. In various embodiments, the first layer and/or additional layers may have a thickness of about 10, 20, 30, 40, 50, 75, 100, 150, 200, 250, 300, 350, 400, 450, or 500 microns. The layer thickness may vary along the additive-manufacturing build direction or the layer thickness may be constant.

In some embodiments, the first solid layer is in a crystal orientation selected from crystal lattice planes (100), (110), (111), or an angle between two of the crystal lattice planes (100), (110), and (111). In some embodiments, an angle between two crystal lattice planes is from about 0.01 degrees to about 90 degrees.

The method may further comprise repeating steps (b) and (c) a plurality of times to generate a plurality of solid layers by sequentially solidifying a plurality of melt layers in an additive-manufacturing build direction, wherein the plurality of solid layers is a final single crystal of the first metal or metal alloy. The method is not limited in principle to the number of solid layers that may be fabricated. A "plurality of solid layers" means at least 2 layers, such as at least 10 individual solid layers in the additively manufactured component. The number of solid layers may be much greater than 10, such as about 100, 1000, 10000, or more. The plurality of solid layers may be characterized by an average layer thickness of at least 10 microns, such as about, or at least about, 10, 20, 30, 40, 50, 75, 100, 150, 200, 250, 300, 350, 400, 450, or 500 microns.

One or more additive-manufacturing support structures may additionally be fabricated from the plurality of the solid layers. The support structure(s), like the build plate, will usually be removed for recovery of the single-crystal metallic component. One difference with the build plate is that the support structure(s) are also additively manufactured in the same procedure as for the main parts of the component. The support structure(s) may form one continuous crystal with the seed single crystal and the final single crystal.

The final single crystal may be in a crystal orientation selected from crystal lattice planes (100), (110), (111), or an angle between two of the crystal lattice planes (100), (110), and (111). In some embodiments, the final single crystal has a crystal orientation that changes along the additive-manufacturing build direction, with no grain boundaries.

The method may further include recovering the final single crystal of the first metal or metal alloy as an additively manufactured single-crystal metallic component. For example, the build plate may be removed by cutting or selective melting. In principle, the build plate may be reused, which may require cleaning, polishing, or etching to prepare the build-region surface for the next round of crystal growth. In addition to removal of the build plate, other conventional steps may be applied to recover the single-crystal metallic component, such as removing unused powder, removing support structures, machining, heat-treating, surface finishing, etc.

In certain embodiments, the build plate may be utilized along with the additively manufactured component. For example, for repairing a turbine blade, the blade may be used as the build plate to seed crystal growth and additively manufacture on the blade to repair it. Similarly, an enhanced feature may be added via additive manufacturing directly to a turbine blade or another object, acting as a build plate, wherein the enhanced feature has the same crystal orientation as the blade. In general, a build plate may function itself as a part (e.g. as a portion of a larger structure, or as the primary structure itself), or as a component that is or may be repaired using the methods disclosed herein.

Some variations of the invention provide an additively manufactured single-crystal metallic component produced by a process comprising:
(a) providing a metal-containing feedstock comprising a first metal or metal alloy;
(b) providing a build plate comprising a build region consisting of a seed single crystal of a second metal or metal alloy;
(c) exposing a first amount of the metal-containing feedstock to an energy source for melting the first amount of the metal-containing feedstock, thereby generating a first melt layer disposed on the build region;
(d) solidifying the first melt layer, thereby generating a first solid layer, disposed on the build region, of an additively manufactured metal component, wherein the first solid layer is a single crystal of the first metal or metal alloy;
(e) repeating steps (b) and (c) a plurality of times to generate a plurality (at least two) of solid layers by sequentially solidifying a plurality of melt layers in an additive-manufacturing build direction, wherein the plurality of solid layers is a final single crystal of the first metal or metal alloy;
(f) optionally separating the final single crystal from the build plate; and
(g) recovering the final single crystal of the metal or metal alloy as an additively manufactured single-crystal metallic component.

Some variations of the invention provide a single-crystal metallic article comprising:
(a) a build plate comprising a build region consisting of a seed single crystal of a second metal or metal alloy; and
(b) a plurality of solid layers forming a component single crystal of a first metal or metal alloy, wherein the component single crystal is disposed on the build region,
wherein the build region and the plurality of solid layers form a continuous crystallographic texture.

Note that the single-crystal metallic article contains the build plate, in contrast to the single-crystal metallic component (discussed below) which does not contain the build plate. Normally, the build plate is removed from the single-crystal metallic article, to generate the desired single-crystal metallic component. In some cases, the build plate remains and is part of the final component. For example, a build plate could be designed to form a wall or structural element of the final component. Or, the build plate may be a structural component (such as a turbine blade) to be repaired or enhanced, as explained above.

In some embodiments, the build plate comprises an exterior layer that consists of the seed single crystal of the second metal or metal alloy. In some embodiments, the build plate comprises an interior build region in the shape of a circle, square, or other geometry, with at least one exposed surface capable of seeding crystal growth. In some embodiments, the build plate comprises multiple interior build regions each with an exposed surface capable of seeding crystal growth during layer formation. The build plate may be three-dimensional, such as a sphere, cube, or cuboid, with one or more surfaces (or the entire surface) capable of seeding crystal growth. In certain embodiments, the build plate consists of the seed single crystal, i.e., the entire build plate (of arbitrary geometry) is a single crystal. The build plate may have a thickness from 100 microns to 1 centimeter, for example. The thickness of the build region may be less than the thickness of the build plate, provided the build region is large enough to effectively seed crystallization.

The seed single crystal may be in a crystal orientation selected from crystal lattice planes (100), (110), (111), or an angle between two of the crystal lattice planes (100), (110), and (111). The component single crystal may be in one or more crystal orientations selected from crystal lattice planes (100), (110), (111), or an angle between two of the crystal lattice planes (100), (110), and (111). In some embodiments, the seed single crystal and the component single crystal form one continuous crystal.

The single-crystal metallic article may be produced via additive manufacturing in an additive-manufacturing build direction, at least for the component single crystal. The component single crystal may have a crystal orientation that varies along the additive-manufacturing build direction. The plurality of solid layers may have an average thickness from 10 microns to 500 microns.

In some embodiments, the first and/or second metal or metal alloy is a nickel alloy. In some embodiments, the first and/or second metal or metal alloy is a cobalt alloy, wherein the cobalt alloy optionally contains Al, Cr, Re, Ni, W, or a combination thereof.

Some variations provide a single-crystal metallic component comprising a plurality of solid layers in an additive-manufacturing build direction, wherein the plurality of solid layers forms a component single crystal of a metal or metal alloy with a continuous crystallographic texture. The plurality of solid layers may have an average thickness from 10 microns to 500 microns. In some embodiments, the component single crystal has a crystal orientation that varies along the additive-manufacturing build direction.

In some embodiments, the component single crystal is in one or more crystal orientations selected from crystal lattice planes (100), (110), (111), or an angle between two of the crystal lattice planes (100), (110), and (111).

A "continuous crystallographic texture" for the plurality of solid layers means that the average angle of misorientation is less than 5 degrees, calculated as an average over all crystal unit cells present in the plurality of solid layers. Preferably, the average angle of misorientation is less than 4, 3, 2, 1, 0.5, 0.4, 0.3, 0.2, or 0.1 degrees, calculated over all the solid layers.

The single-crystal metallic component does not normally contain the build plate, following removal of it. However, the use of a single-crystal build plate (rather than a polycrystalline build plate) may be detectible in the single-crystal metallic component, by examining the surface(s) that were previously connected to the build plate. In particular, in preferred embodiments, the component single crystal will not have a crystallographic discontinuity at a surface arising from removal of a build plate. A "crystallographic discontinuity" means that two or more different crystals are, or were previously, joined non-epitaxially. Note that a crystallographic discontinuity will only be absent if the build plate and component were crystallographically continuous at the interface prior to separation, and if the separation itself (e.g., from micromachining) does not cause significant crystallographical imperfections at the interface.

In certain embodiments, the metal or metal alloy component is semi-crystalline. A "semi-crystalline" material contains between 2 and 10 individual crystals, separated by grain boundaries, in contrast to a polycrystalline material that contains more than 10 randomly oriented crystals. For example, a semi-crystalline metal or metal alloy component may contain many layers with an overall crystallographic texture having multiple long-range (>1 cm) orientations over the entire build but with continuous crystals on length scales less than 1 mm. The metal or metal alloy component may contain a plurality of crystals, each at least 1 mm in size, with the total number of crystals defined by the overall size of the component. The number of individual crystals in a semi-crystalline component may be 2, 3, 4, 5, 6, 7, 8, 9, or 10. In some articles in which there are two crystals, one crystal is the build plate and one crystal is the additively manufactured component.

For a given metal or metal alloy system, there is often more than one form or phase of crystal (polymorphism). In some embodiments, the overall metal or metal alloy component contains at least 90 vol % of a selected crystal form or phase. Preferably, the metal or metal alloy component contains at least 95 vol %, 99 vol %, or 99.9 vol % (e.g., 100 vol %) of the selected crystal form or phase.

The metal or metal alloy, in the single-crystal metallic component, may be a nickel alloy and/or a cobalt alloy, wherein the cobalt alloy optionally contains Al, Cr, Re, Ni, W, or a combination thereof. Other examples of metal alloys are Inconel Alloy 625 and Inconel Alloy 718. In general, the single-crystal metallic component may contain one or more alloying elements selected from the group consisting of H, Li, Be, B, C, N, O, F, Na, P, S, Cl, K, Si, Fe, Cu, Mn, Mg, Cr, V, Bi, Pb, Zr, Ca, Sc, Co, Zn, Ga, Ge, As, Se, Br, Rb, Sr, Y, Nb, Mo, Tc, Ru, Rh, Pd, Ag, Cd, In, Sn, Te, I, Cs, Ba, Hf, Ta, W, Re, Os, Ir, Pt, Au, Hg, Tl, Ce, Nd, and combinations thereof.

An exemplary single-crystal metallic component is a turbine blade. Other single-crystal metallic components may include discs, casings, stator vane segments, metallic conductors, semiconductors, and materials for nonlinear optics or apochromatic refracting telescopes.

Other variations of the invention provide an additive-manufacturing build plate comprising a build region consisting of a single crystal of a metal or metal alloy (e.g., a nickel alloy or a cobalt alloy). The intended use of the additive-manufacturing build plate is to serve as a single-crystal substrate for the fabrication of a single-crystal additively manufactured component, as described above. The single crystal in the build plate may be in a crystal orientation selected from crystal lattice planes (100), (110), (111), or an angle between two of the crystal lattice planes (100), (110), and (111). In some embodiments, the build plate comprises an exterior layer that consists of a single crystal of the metal or metal alloy. In certain embodiments, the build plate consists of a single crystal of the metal or metal alloy.

Additional energy sources for additive manufacturing will now be described. Generally, the energy source may be a laser beam, an electron beam, alternating current, direct current, plasma energy, induction heating from an applied magnetic field, ultrasonic energy, other sources, or a combination thereof. Typically, the energy source is a laser beam or an electron beam. Preferably, the energy source is a laser diode, which is useful especially to provide a gradient digital energy pattern.

The additive manufacturing may utilize a technique selected from the group consisting of selective laser melting, electron beam melting, laser engineered net shaping, selective laser sintering, direct metal laser sintering, integrated laser melting with machining, laser powder injection, laser consolidation, direct metal deposition, wire-directed energy deposition, plasma arc-based fabrication, ultrasonic consolidation, and combinations thereof, for example.

Selective laser melting utilizes a laser (e.g., a Yb-fiber laser) to provide energy for melting. Selective laser melting designed to use a high power-density laser to melt and fuse metallic powders together. The process has the ability to fully melt the metal material into a solid 3D part. A combination of direct drive motors and mirrors, rather than fixed optical lens, may be employed. An inert atmosphere is usually employed. A vacuum chamber may be fully purged between build cycles, allowing for lower oxygen concentrations and reduced gas leakage.

Electron beam melting uses a heated powder bed of metal that is then melted and formed layer by layer, in a vacuum, using an electron beam energy source similar to that of an electron microscope. Metal powder is welded together, layer by layer, under vacuum.

Laser engineered net shaping is a powder-injected technique that operates by injecting metal powder into a molten pool of metal using a laser as the energy source. Laser engineered net shaping is useful for fabricating metal parts directly from a computer-aided design solid model by using a metal powder injected into a molten pool created by a focused, high-powered laser beam. Laser engineered net shaping is similar to selective laser sintering, but the metal powder is applied only where material is being added to the part at that moment.

Direct metal laser sintering process works by melting fine powders of metal in a powder bed, layer by layer. A laser supplies the necessary energy and the system operates in a protective atmosphere, typically of nitrogen or argon.

Another approach utilizes powder injection to provide the material to be deposited. Instead of a bed of powder that is reacted with an energy beam, powder is injected through a nozzle that is then melted to deposit material. The powder may be injected through an inert carrier gas or by gravity feed. A separate shielding gas may be used to protect the molten metal pool from oxidation.

Directed energy deposition utilizes focused energy (either an electron beam or laser beam) to fuse materials by melting as the material is being deposited. Powder or wire feedstock can be utilized with this process. Powder-fed systems, such as laser metal deposition and laser engineered net shaping, blow powder through a nozzle, with the powder melted by a laser beam on the surface of the part. Laser-based wirefeed systems, such as laser metal deposition-wire, feed wire through a nozzle with the wire melted by a laser, with inert gas shielding in either an open environment (gas surrounding the laser), or in a sealed gas enclosure or chamber.

Some embodiments utilize wire feedstock and an electron beam heat source to produce a near-net shape part inside a vacuum chamber. An electron beam gun deposits metal via the wire feedstock, layer by layer, until the part reaches the desired shape. Then the part optionally undergoes finish heat treatment and machining. Wire can be preferred over powder for safety and cost reasons.

Herderick, "Additive Manufacturing of Metals: A Review," *Proceedings of Materials Science and Technology* 2011, Additive Manufacturing of Metals, Columbus, Ohio, 2011, pp. 1413-1425, is hereby incorporated by reference herein for its teaching of various additive manufacturing techniques.

In any of these additive-manufacturing techniques, post-production processes such as heat treatment, light machining, surface finishing, coloring, stamping, or other finishing operations may be applied. Also, several additively manufactured parts may be joined together chemically or physically to produce a final object.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A single-crystal metallic article comprising:
   (a) a build plate comprising a build region consisting of a seed single crystal of a nickel alloy or a cobalt alloy; and
   (b) a plurality of solid layers forming a component single crystal of said nickel alloy or said cobalt alloy,
   wherein said component single crystal is disposed on said build region,
   wherein said component single crystal is produced via additive manufacturing in an additive-manufacturing build direction,
   wherein said component single crystal, on length scales of 100 µm along said additive-manufacturing build direction, contains crystallographic misorientations that are less than 5 degrees on average,
   wherein said build region and said plurality of solid layers form a continuous crystallographic texture, and
   wherein said seed single crystal and said component single crystal form one continuous crystal.

2. The single-crystal metallic article of claim 1, wherein said build plate comprises an exterior layer that consists of said seed single crystal of said first metal or metal alloy.

3. The single-crystal metallic article of claim 1, wherein said build plate consists of said seed single crystal.

4. The single-crystal metallic article of claim 1, wherein said seed single crystal is in a crystal orientation selected from crystal lattice planes (100), (110), (111), or an angle between two of said crystal lattice planes (100), (110), and (111).

5. The single-crystal metallic article of claim 1, wherein said component single crystal is in one or more crystal orientations selected from crystal lattice planes (100), (110), (111), or an angle between two of said crystal lattice planes (100), (110), and (111).

6. The single-crystal metallic article of claim 1, wherein said component single crystal has a crystal orientation that varies along said additive-manufacturing build direction.

7. A single-crystal metallic component comprising a plurality of solid layers in an additive-manufacturing build direction,
   wherein said plurality of solid layers forms a component single crystal of a nickel alloy or cobalt alloy with a continuous crystallographic texture,
   wherein said component single crystal has a crystal orientation that varies along said additive-manufacturing build direction,
   wherein said component single crystal, on length scales of 100 µm along said additive-manufacturing build direction, contains crystallographic misorientations that are less than 5 degrees on average, and
   wherein said component single crystal does not have a crystallographic discontinuity at a surface arising from removal of a build plate.

8. The single-crystal metallic component of claim 7, wherein said component single crystal, on length scales of 100 µm along said additive-manufacturing build direction, contains crystallographic misorientations that are less than 2 degrees on average.

9. The single-crystal metallic component of claim 7, wherein said component single crystal is in one or more crystal orientations selected from crystal lattice planes (100), (110), (111), or an angle between two of said crystal lattice planes (100), (110), and (111).

* * * * *